(12) United States Patent
Chen et al.

(10) Patent No.: US 11,324,090 B2
(45) Date of Patent: *May 3, 2022

(54) DETECTION CIRCUIT AND DETECTION METHOD FOR A TRIAC DIMMER

(71) Applicant: Silergy Semiconductor Technology (Hangzhou) LTD, Hangzhou (CN)

(72) Inventors: Huiqiang Chen, Hangzhou (CN); Zhishuo Wang, Hangzhou (CN); Jianxin Wang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/089,862

(22) Filed: Nov. 5, 2020

(65) Prior Publication Data

US 2021/0059029 A1 Feb. 25, 2021

Related U.S. Application Data

(63) Continuation of application No. 16/407,443, filed on May 9, 2019, now Pat. No. 10,863,601.

(30) Foreign Application Priority Data

May 25, 2018 (CN) .......................... 201810560604.X

(51) Int. Cl.
*H05B 45/3575* (2020.01)
*H03K 5/24* (2006.01)
*H05B 45/10* (2020.01)

(52) U.S. Cl.
CPC .......... *H05B 45/3575* (2020.01); *H03K 5/24* (2013.01); *H05B 45/10* (2020.01)

(58) Field of Classification Search
CPC .... H05B 45/37; H05B 45/10; H05B 45/3575; H05B 47/10; H05B 45/50; H05B 45/14; H05B 39/048; H05B 45/395; H05B 47/16; H05B 39/04
See application file for complete search history.

(56) References Cited

U.S. PATENT DOCUMENTS

| | | |
|---|---|---|
| 8,581,518 B2 | 11/2013 | Kuang et al. |
| 2011/0127925 A1 | 6/2011 | Huang et al. |
| 2014/0252972 A1 | 9/2014 | Cao et al. |
| 2017/0318639 A1 | 11/2017 | Wang et al. |
| 2018/0115234 A1 * | 4/2018 | Liu ........................ H05B 45/10 |
| 2018/0139816 A1 * | 5/2018 | Liu ........................ H05B 45/10 |
| 2018/0295685 A1 | 10/2018 | Wang et al. |
| 2018/0295690 A1 | 10/2018 | Chen et al. |
| 2018/0310376 A1 | 10/2018 | Huang et al. |
| 2019/0150240 A1 | 5/2019 | Yu et al. |
| 2021/0243863 A1 * | 8/2021 | Mun ....................... H05B 45/36 |

* cited by examiner

*Primary Examiner* — Wei (Victor) Y Chan

(57) ABSTRACT

A detection circuit configured to detect the presence of a TRIAC dimmer for an LED driver, can include: a sampling circuit configured to receive a DC bus voltage, and to generate a voltage sampling signal that characterizes the DC bus voltage; and a detector configured to determine whether the LED driver is provided with the TRIAC dimmer in accordance with a duration of the voltage sampling signal being continuously greater than a first reference voltage.

12 Claims, 5 Drawing Sheets

DETECTION CIRCUIT AND DETECTION METHOD FOR A TRIAC DIMMER

RELATED APPLICATIONS

This application is a continuation of the following application, U.S. patent application Ser. No. 16/407,443, filed on May 9, 2019, and which is hereby incorporated by reference as if it is set forth in full in this specification, and which also claims the benefit of Chinese Patent Application No. 201810560604.X, filed on May 25, 2018, which is incorporated herein by reference in its entirety.

FIELD OF THE INVENTION

The present invention generally relates to the field of power electronics, and more particularly to LED drivers, along with associated detection circuits and detection methods.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Figure 1:
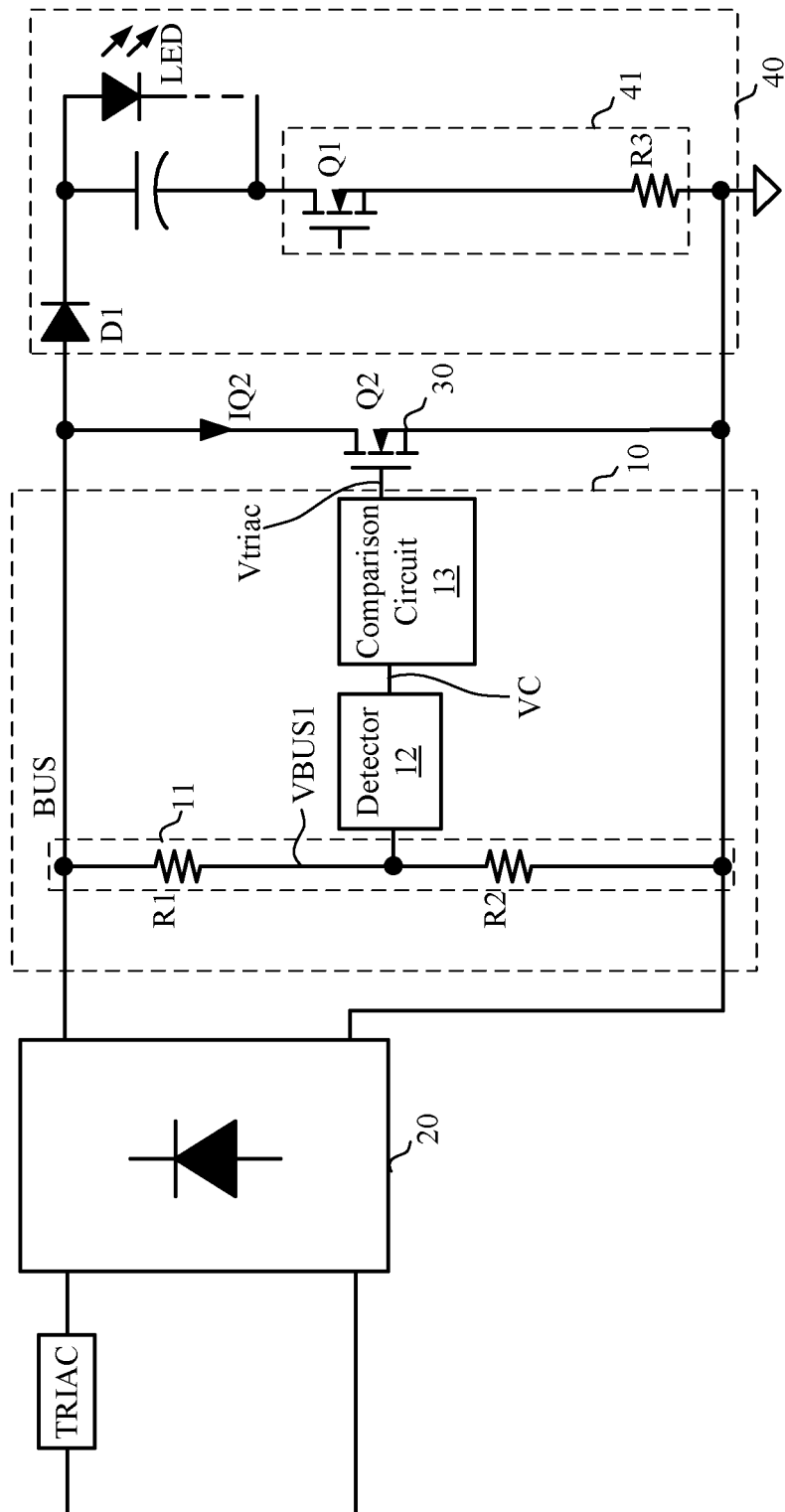
FIG. 1 is a schematic block diagram of an example LED driver, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Light-emitting diode (LED) lighting is an illumination approach with semiconductor solid-state light-emitting devices. It uses a solid-state semiconductor chip as a luminescent material. In the semiconductor, carriers recombine to release excess energy, thereby causing photon emission, whereby red, yellow, blue, and green light is directly emitted. Further, light of any color can be emitted by adding phosphors with the principle of three primary colors. As such, LED lightings are lighting fixtures made by LED as the underlying light source.

A dimmer can be used in order to adjust different luminance of the light. By decreasing or increasing root mean square (RMS) voltage, the average power light can generate light(s) of different intensities. Due to its high efficiency and energy saving, LED lighting has widely replaced traditional incandescent lamps and fluorescent lamps. For LED lighting systems with a triode alternating current switch (TRIAC) dimmer, due to the characteristics of the TRIAC dimmer itself, a certain amount of holding current is required when the TRIAC dimmer is turned on in order to maintain reliable conduction. Therefore, an LED driver with a TRIAC dimmer typically has corresponding bleeder circuits. When the main loop current is less than the holding current of the TRIAC, the bleeder circuit can provide additional current to maintain conduction of the TRIAC. However, when an LED driver with a bleeder circuit is applied to the LED lighting system without a TRIAC dimmer, the bleeder circuit may consume additional power, thus reducing the efficiency of the overall LED lighting system.

In one embodiment, a detection circuit configured to detect the presence of a TRIAC dimmer for an LED driver, can include: (i) a sampling circuit configured to receive a DC bus voltage, and to generate a voltage sampling signal that characterizes the DC bus voltage; and (ii) a detector configured to determine whether the LED driver is provided with the TRIAC dimmer in accordance with a duration of the voltage sampling signal being continuously greater than a first reference voltage.

Referring now to FIG. 1, shown is a schematic block diagram of an example LED driver in accordance with embodiments of the present invention. In this example, the LED driver can include rectifier circuit 20, detection circuit 10 of the TRIAC dimmer, bleeder circuit 30, and circuit module 40. When the LED driver is provided with a TRIAC dimmer "TRIAC" (as shown in this particular example), which can be coupled between an AC input port and rectifier circuit 20, rectifier circuit 20 can rectify an AC signal chopped by the TRIAC dimmer to a DC signal that is output to a DC bus (BUS). When the LED driver is not provided with a TRIAC dimmer, rectifier circuit 20 can directly rectify the AC signal to the DC signal that is output to the DC bus.

In this particular example, detection circuit 10 of the TRIAC dimmer can determine whether the LED driver is provided with a TRIAC dimmer. Operation states of bleeder circuit 30 and other circuits of the LED driver can be determined, thereby reducing power consumption of the system and improving efficiency. For example, detection circuit 10 of the TRIAC dimmer can include sampling circuit 11, detector 12, and comparison circuit 13. Sampling circuit 11 can include a voltage division unit that may receive DC bus voltage VBUS of DC bus "BUS," and may generate voltage sampling signal VBUS1 that characterizes DC bus voltage VBUS.

Detector 12 can compare voltage sampling signal VBUS1 against reference voltage Vref1 to obtain control voltage signal VC. Control voltage VC can characterize the duration of when voltage sampling signal VBUS1 is continuously greater than reference voltage Vref1. Also, reference voltage Vref1 may be determined according to DC bus voltage VBUS. In this example, reference voltage Vref1 can be greater than the voltage sampling signal of the DC bus voltage before the TRIAC dimmer is turned on, and less than the voltage sampling signal of the DC bus voltage after the TRIAC dimmer is turned on. Comparison circuit 13 can compare control voltage signal VC against reference voltage Vref2 to obtain detection signal Vtriac of the TRIAC dimmer that indicates whether the LED driver is provided with a TRIAC dimmer.

In this particular example, bleeder circuit 30 can include transistor Q2. It should be understood that, bleeder circuit 30 can also include a detection component for a bleeder current. For example, detection component for the bleeder current can be a detection resistor coupled in series with transistor Q2, in order to generate a current sampling signal that characterizes bleeder current IQ2, such that bleeder current IQ2 may be controlled. Bleeder circuit 30 can be provided for reliable operation of the TRIAC dimmer, and may be coupled with DC bus BUS. As such, the loss of bleeder circuit 30 is the product of DC bus voltage VBUS and bleeder current IQ2. Due to the relatively large DC bus voltage VBUS, the power loss of bleeder circuit 30 typically may not be ignored. Therefore, detection circuit 10 of the TRIAC dimmer can be set to identify whether the LED driver is provided with the TRIAC dimmer, in order to turn on/off bleeder circuit 30, in order to reduce such losses.

In this example, circuit module 40 can include LED load "LED," linear regulation circuit 41, and diode D1. In some cases, diode D1 can be omitted from the circuit. Linear regulation circuit 41 can include transistor Q1 and detection component R3. Detection component R3 can generate a current sampling signal that characterizes a drive current of the LED load. Also, detection component R3 can be a resistor or other suitable component(s) that may sample the current. Linear regulation circuit 41 can also include a controller in order to adjust the control voltage of transistor Q1 based on the current sampling signal. In this example, linear regulation circuit 41 can integrate the LED load in a same package structure or device, while in other cases, the LED load can be arranged in a separate package structure from the linear components in linear regulation circuit 41.

Figure 2:
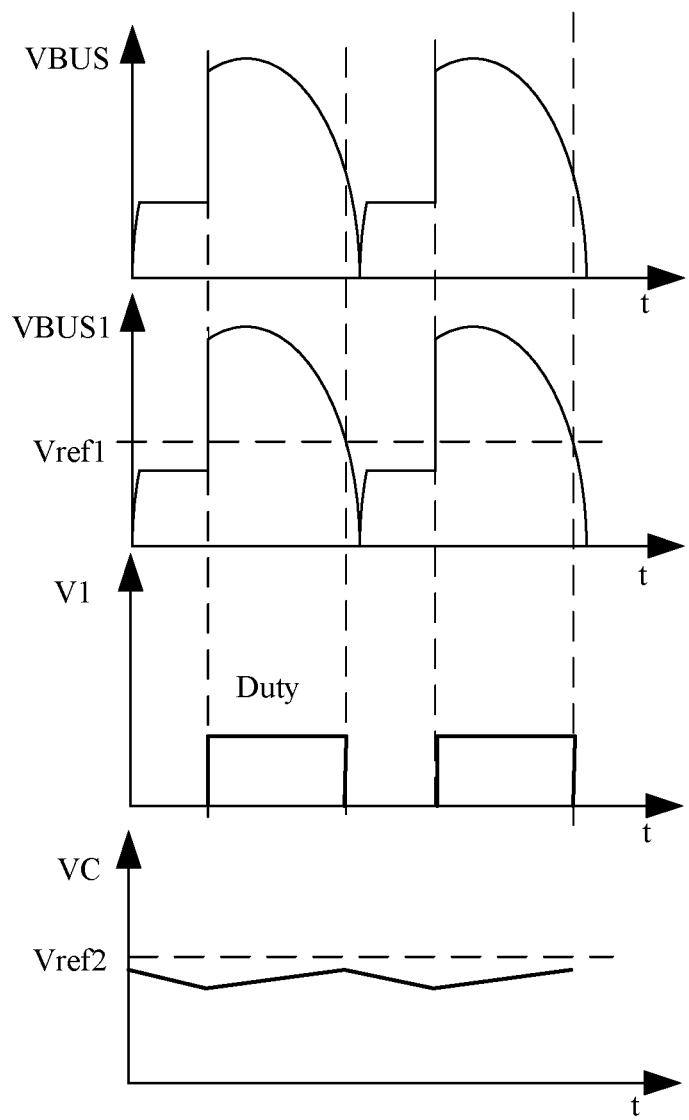
FIG. 2 is a waveform diagram of example operation of an LED driver with a TRIAC dimmer, in accordance with embodiments of the present invention.
Figure 3:
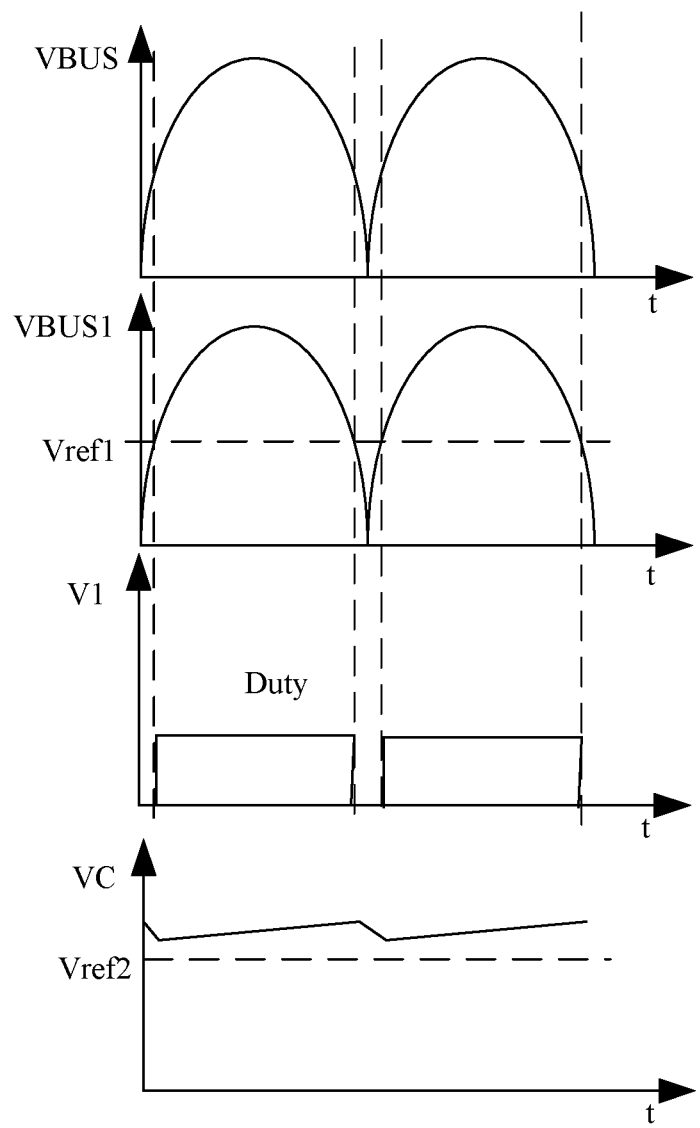
FIG. 3 is a waveform diagram of example operation of an LED driver without the TRIAC dimmer, in accordance with embodiments of the present invention.

Referring now to FIGS. 2 and 3, shown are waveform diagrams of example operation of an LED driver with and without a TRIAC dimmer, in accordance with embodiments of the present invention. Based on the waveform diagrams, whether the LED driver is provided with a TRIAC dimmer may have a relatively large impact on DC bus voltage VBUS. As shown in FIG. 2, when the LED driver is provided with the TRIAC dimmer, the waveform of DC bus voltage VBUS is a waveform that is rectified by the rectifier circuit and partially chopped. As shown in FIG. 3, when the LED driver is not provided with the TRIAC dimmer, the waveform of DC bus voltage VBUS is a standard wave as rectified by the rectifier circuit. Therefore, whether the LED driver is provided with the TRIAC dimmer can be identified by detecting voltage information of DC bus voltage VBUS.

Figure 4:
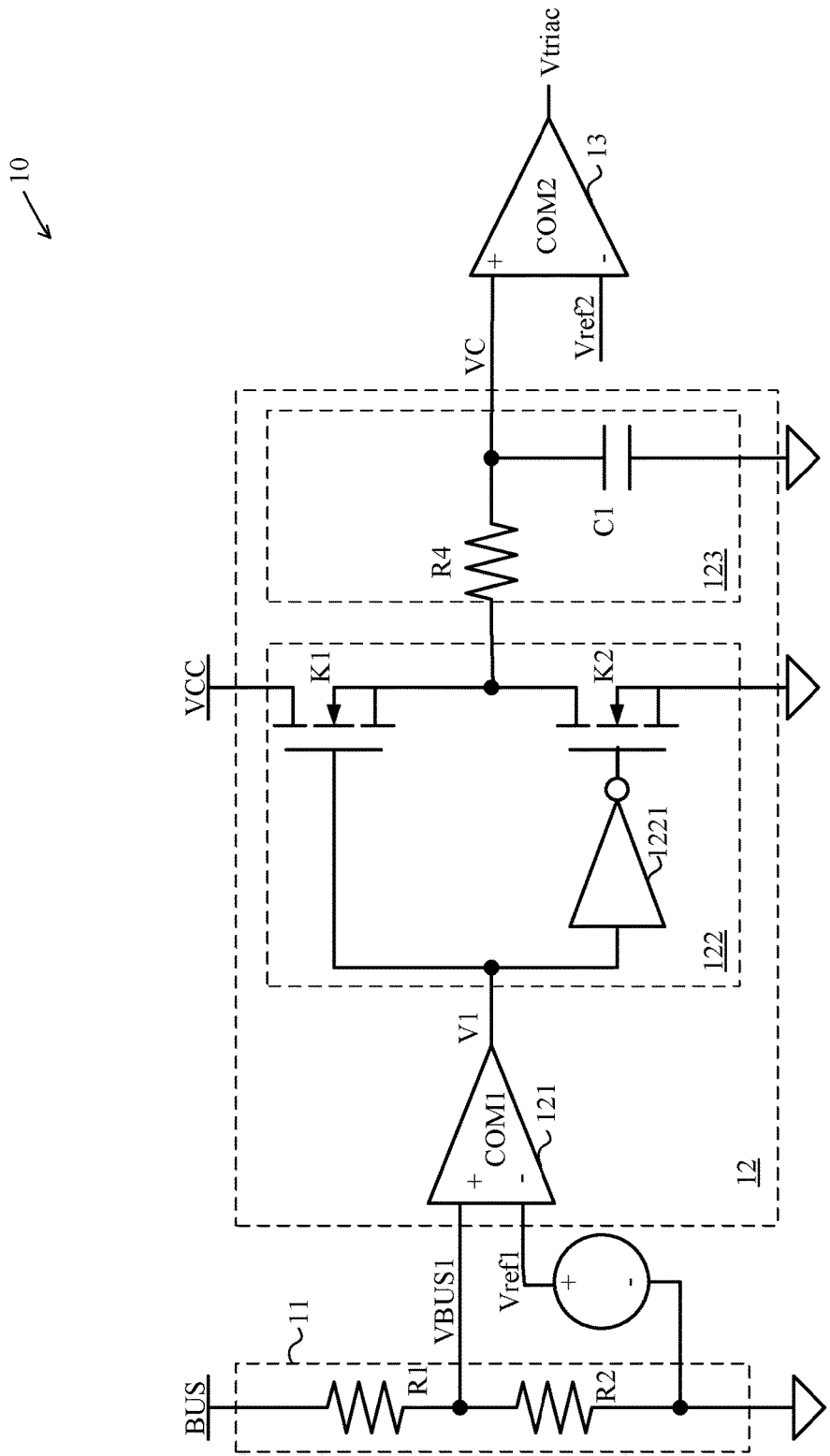
FIG. 4 is a schematic block diagram of an example detection circuit of the TRIAC dimmer, in accordance with embodiments of the present invention.

Referring also to FIG. 4, shown is schematic block diagram of an example detection circuit of the TRIAC dimmer in accordance with embodiments of the present invention. In this particular example, voltage sampling signal VBUS1 can be compared against reference voltage Vref1 to obtain comparison signal V1. When voltage sampling signal VBUS1 is greater than reference voltage Vref1, comparison signal V1 can go high. When voltage sampling signal VBUS1 is less than reference voltage Vref1, comparison signal V1 may go low. Thus, the pulse width of comparison signal V1 may be used to characterize the duration within a period when voltage sampling signal VBUS1 is continuously greater than reference voltage Vref1. To facilitate comparison, comparison signal V1 may be averaged to obtain a relatively stable control voltage signal VC, and control voltage signal VC can be used to characterize the duration of voltage sampling signal VBUS1 being continuously greater than reference voltage Vref1 within a given period.

Further, control voltage signal VC can be compared against reference voltage Vref2 to obtain detection signal Vtriac of the TRIAC dimmer for identifying whether the LED driver is provided with a TRIAC dimmer. When control voltage signal VC is greater than reference voltage Vref2, detection signal Vtriac of the TRIAC dimmer may be high. In this case, the system can enter a control mode without the TRIAC dimmer. In this control mode, bleeder circuit 30 may be disabled (to not operate). When control voltage signal VC is less than reference voltage Vref2, detection signal Vtriac of the TRIAC dimmer can be low. In this case, the system can enter a control mode with the TRIAC dimmer. In this mode, bleeder circuit 30 can be enabled to operate such that it is turned on and off according to circuit requirements, in order to maintain normal operation of the TRIAC dimmer.

In the example of FIG. 4, detection circuit 10 of the TRIAC dimmer can include sampling circuit 11, detector 12, and comparison circuit 13. Sampling circuit 11 can include a voltage division circuit that includes resistors R1 and R2 coupled in series. One terminal of resistor R1 can connect to DC bus BUS and the other terminal of resistor R1 can connect to one terminal of resistor R2. The other terminal of resistor R2 can connect to ground. Also, voltage sampling signal VBUS1 that characterizes DC bus voltage VBUS can be generated at a common node of resistors R1 and R2.

Detector 12 can include comparator 121, switching circuit 122, and averaging circuit 123. In this example, a non-inverting input of comparator 121 can receive voltage sampling signal VBUS1, an inverting input of comparator 121 can receive reference voltage Vref1, and an output of comparator 121 can generate comparison signal V1. Switching circuit 122 can include switches K1 and K2 coupled in series. One terminal of switch K1 can connect to DC voltage VCC, and another terminal of switch K1 can connect to one terminal of switch K2. Another terminal of switch K2 can connect to ground. In this particular example, switching circuit 122 can be controlled by comparison signal V1.

For example, switch K1 can be directly controlled by comparison signal V1 to be turned on/off, and switch K2 can be controlled by the inverted version of comparison signal V1 to be turned on/off. Thus, comparison signal V1 can be coupled to a control terminal of switch K2 through inverter 1221. When comparison signal V1 is high, switch K1 can be turned on, and averaging circuit 123 can be charged by DC voltage VCC. When comparison signal V1 is low, switch K2 may be turned on, and averaging circuit 123 can be discharged to ground. In this particular example, averaging circuit 123 can be coupled to the common node of switches K1 and K2, in order to generate stable control voltage signal VC.

For example, averaging circuit 123 can include resistor R4 and capacitor C1 coupled in series. Also, control voltage signal VC can be generated at a common node of resistor R4 and capacitor C1. Therefore, with switching circuit 122 and averaging circuit 123, comparison signal V1 in pulse form can be converted into stable control voltage signal VC. When comparison signal V1 is high, averaging circuit 123 can be charged by DC voltage VCC, such that control voltage signal VC can be gradually increased. When comparison signal V1 is low, averaging circuit 123 may be discharged to ground, such that control voltage signal VC can be gradually decreased.

By integrating comparison signal V1, stable control voltage signal VC can be obtained. In this example, comparison signal V1 can be integrated by one switching circuit and one averaging circuit, in order to obtain stable control voltage signal VC. It should be understood that other circuits that may also realize the integration function can additionally or alternatively be utilized. In this example, the non-inverting input of comparison circuit 13 can receive control voltage signal VC, the inverting input of comparison circuit 13 can receive reference voltage Vref2, and the output can generate detection signal Vtriac of the TRIAC dimmer that may indicate whether the LED driver is provided with a TRIAC dimmer.

Figure 5:
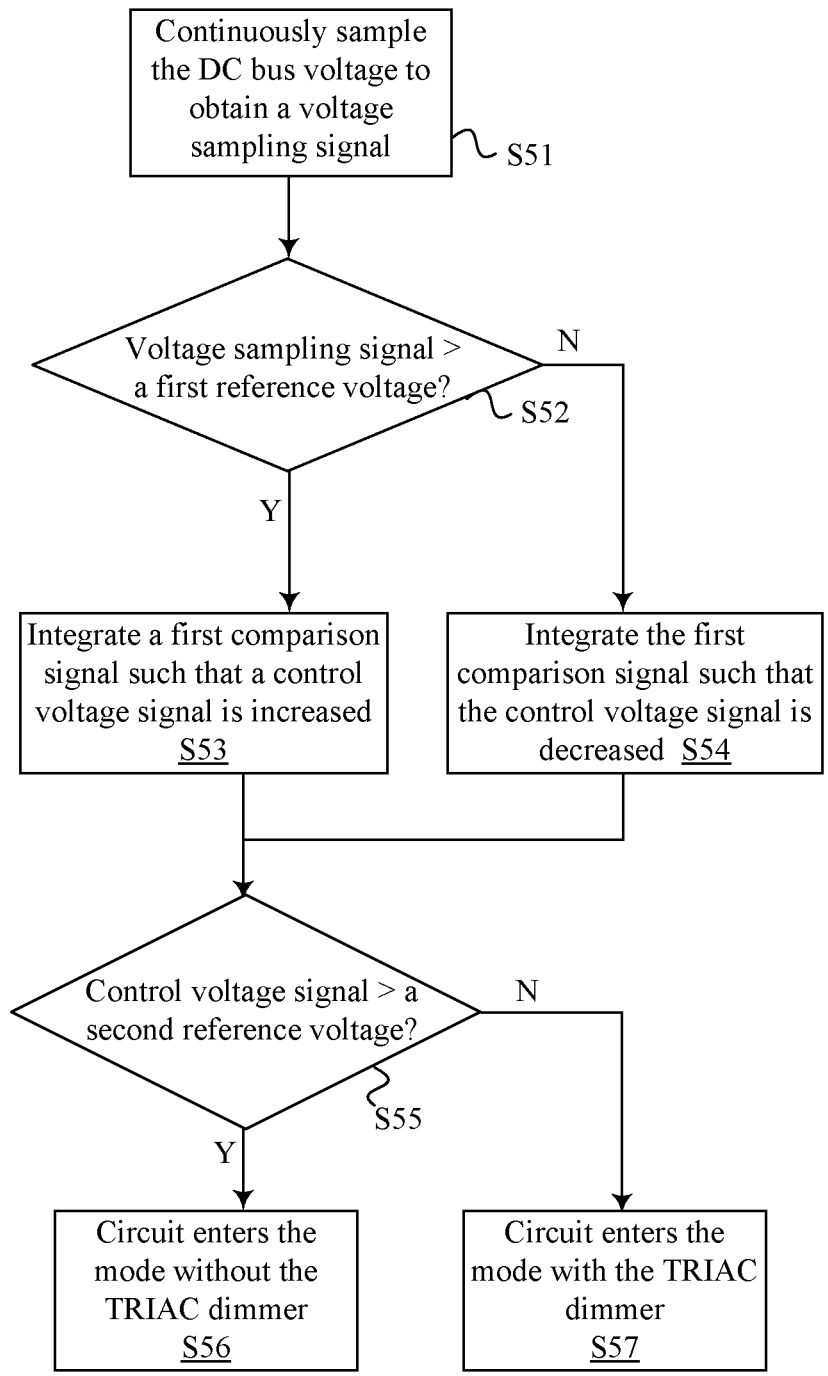
FIG. 5 is a flow diagram of an example detection method for the TRIAC dimmer, in accordance with embodiments of the present invention.

Referring now to FIG. 5, shown is a flow diagram of an example detection method for the TRIAC dimmer in accordance with embodiments of the present invention. In S51, the DC bus voltage can be continuously sampled to obtain a voltage sampling signal (e.g., VBUS1). At S52, whether the voltage sampling signal is greater than a first reference voltage (e.g., Vref1) can be determined. If the voltage sampling signal is greater than the first reference voltage, S53 can be performed; otherwise, S54 can be performed. At S53, the first comparison signal (e.g., V1) can be integrated, such that a control voltage signal (e.g., VC) can be increased. In S54, the first comparison signal can be integrated, such that the control voltage signal can be decreased.

At S55, whether the control voltage signal is greater than a second reference voltage (e.g., Vref2) can be determined. If the control voltage signal is greater than the second reference voltage, S56 can be performed; otherwise, S57 can be performed. At S56, the circuit may enter a control mode without the TRIAC dimmer (e.g., whereby the bleeder circuit is disabled). At S57, the circuit may enter a control mode with the TRIAC dimmer (e.g., whereby the bleeder circuit is enabled).

In particular embodiments, a voltage sampling signal that is generated by detecting a DC bus voltage can be compared against a first reference voltage, in order to obtain a continuous control voltage signal that characterizes the duration in which the voltage sampling signal is continuously greater than the first reference voltage. Then, the control voltage signal can be compared against a second reference voltage to obtain a detection signal of the TRIAC dimmer, such that whether an LED driver is provided with the TRIAC dimmer can be determined.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A detection circuit configured to detect the presence of a TRIAC dimmer for an LED driver, the detection circuit comprising:

a) a sampling circuit configured to receive a DC bus voltage, and to generate a voltage sampling signal that characterizes the DC bus voltage;
   b) a detector comprising a switching circuit and an averaging circuit, and being configured to generate a control voltage signal by comparing the voltage sampling signal against a first reference voltage, and to determine whether the LED driver is provided with the TRIAC dimmer by comparing the control voltage signal against a second reference voltage; and
   c) wherein the switching circuit comprises first and second switches coupled in series between the DC bus voltage and ground, and the averaging circuit is configured to generate the control voltage signal and is coupled to a common node of the first and second switches.

2. The detection circuit of claim 1, wherein the first reference voltage is predetermined by the DC bus voltage, and is greater than zero.

3. The detection circuit of claim 1, wherein the detector is configured to compare the voltage sampling signal against the first reference voltage to generate a first comparison signal, and to generate the control voltage signal by an averaging operation of the first comparison signal.

4. The detection circuit of claim 1, wherein:

a) when the control voltage signal is not greater than the second reference voltage, the LED driver is characterized as having the TRIAC dimmer; and
   b) when the control voltage signal is greater than the second reference voltage, the LED driver is characterized as not having the TRIAC dimmer.

5. The detection circuit of claim 1, wherein the detector further comprises a bleeder circuit, wherein:

a) the bleeder circuit is disabled when the detection circuit determines that the LED driver is not provided with the TRIAC dimmer; and
   b) the bleeder circuit is enabled to generate a bleeder current when the detection circuit determines that the LED driver is provided with the TRIAC dimmer.

6. The detection circuit of claim 1, wherein the detector comprises a first comparator having a non-inverting input configured to receive the voltage sampling signal, an inverting input configured to receive the first reference voltage, and an output configured to generate a first comparison signal.

7. The detection circuit of claim 1, wherein the averaging circuit comprises a resistor and a capacitor, configured to generate the control voltage signal at a common node of the resistor and the capacitor.

8. A method of detecting the presence of a TRIAC dimmer for an LED driver, the method comprising:

a) receiving a DC bus voltage;
   b) generating a voltage sampling signal that characterizes the DC bus voltage;
   c) generating, by a switching circuit and an averaging circuit, a control voltage signal by comparing the voltage sampling signal against a first reference voltage, wherein the switching circuit comprises first and second switches coupled in series between the DC bus voltage and ground, and the averaging circuit is configured to generate the control voltage signal and is coupled to a common node of the first and second switches; and
   d) determining whether the LED driver is provided with the TRIAC dimmer by comparing the control voltage signal against a second reference voltage.

9. The method of claim 8, further comprising:
a) comparing the voltage sampling signal against the first reference voltage to generate a first comparison signal; and
b) generating the control voltage signal by an averaging operation of the first comparison signal.

10. The method of claim 8, wherein the first reference voltage is predetermined by the DC bus voltage, and is greater than zero.

11. The method of claim 8, further comprising generating a bleeder current when the LED driver is determined as being provided with the TRIAC dimmer.

12. The method of claim 8, wherein:
a) when the control voltage signal is not greater than the second reference voltage, the LED driver is characterized as having the TRIAC dimmer; and
b) when the control voltage signal is greater than the second reference voltage, the LED driver is characterized as not having the TRIAC dimmer.

* * * * *